United States Patent [19]

Yoneda

[11] Patent Number: 5,084,636
[45] Date of Patent: Jan. 28, 1992

[54] MASTER-SLAVE PROGRAMMABLE LOGIC DEVICES

[75] Inventor: Masato Yoneda, Ichihara, Japan

[73] Assignee: Kawasaki Steel, Hyogo, Japan

[21] Appl. No.: 634,326

[22] Filed: Dec. 26, 1990

[30] Foreign Application Priority Data

Dec. 27, 1989 [JP] Japan .................. 1-339794

[51] Int. Cl.⁵ .......................... H03K 19/177
[52] U.S. Cl. .................. 307/465; 367/272.2; 364/716
[58] Field of Search ............ 307/465, 468, 469, 272.2; 364/716; 365/189.08

[56] References Cited

U.S. PATENT DOCUMENTS

| 4,272,829 | 6/1981 | Schmidt et al. ............. 307/241 X |
| 4,504,904 | 3/1985 | Moore et al. .................. 364/716 X |
| 4,506,341 | 3/1985 | Kalter et al. ................... 364/716 X |
| 4,524,430 | 6/1985 | Page ................................. 307/465 X |
| 4,525,641 | 6/1985 | Cruz et al. ................... 307/272.2 X |
| 4,661,922 | 4/1987 | Thierbach ..................... 307/465 X |
| 4,772,811 | 9/1988 | Fujioka et al. ..................... 307/465 |
| 4,796,229 | 1/1989 | Greer, Jr. et al. ............. 307/465 X |
| 4,876,466 | 10/1989 | Kondou et al. ............. 307/469 X |
| 4,931,946 | 6/1990 | Ravindra et al. ............. 307/465 X |

FOREIGN PATENT DOCUMENTS

| 153457 | 1/1982 | German Democratic Rep. . |
| 252491 | 12/1987 | German Democratic Rep. . |
| 268793 | 6/1989 | German Democratic Rep. . |

Primary Examiner—David Hudspeth
Attorney, Agent, or Firm—Oliff & Berridge

[57] ABSTRACT

In a semiconductor integrated circuit, upstream slave mode logic devices are informed successively of the completion of configuration for each slave mode logic device through a data line connected to the slave side, and a master mode logic device is finally informed of the completion of the configuration for all slave mode logic devices. Hereby, generation of a basic clock for the master mode logic device is controlled without use of a large-scaled circuit such as a pulse counter. Additionally, period of the clock supplied from said master mode logic device to each slave mode logic device is temporarily changed upon the completion of the configuration for all slave mode logic devices to inform each slave mode logic device of the completion of the configuration of all slave mode logic devices.

16 Claims, 9 Drawing Sheets

MASTER-SLAVE PROGRAMMABLE LOGIC DEVICES

BACKGROUND OF THE INVENTION

1. Field of the Invention

The present invention relates to a semiconductor integrated circuit and a programmable logic device for use in the former, the semiconductor integrated circuit including a master mode programmable logic device and at least one slave mode programmable logic device disposed downstream of the master mode logic device and having a logical function thereof defined by configuration data inputted thereinto from the master mode logic device or an upstream slave mode logic device through a data line, and more sepecifically to a semiconductor integrated circuit or a programmable logic device for use in the former which eliminates use of a pulse counter which is to count a sync. clock supplied from a master mode logic device to a slave mode logic device when logical function configuration data is transferred and supplied from an external memory through a programmable logic device in a master mode to a programmable logic device in a slave mode, and interrupt the sync. clock upon the data transfer is completed.

2. Description of the Prior Art

In a programmable logic device, say, a programmable gate array, which has a logical function specified by configuration data inputted from an external memory such as a ROM and an EPROM, etc., it is necessary to define the logical function by supplying logical function configuration data to each programmable logic device prior to use thereof.

It is therefore prior practice as illustrated in FIG. 10 for instance that a plurality of (n+1 in the figure) programmable logic devices are connected in series to each other, a most upstream programmable logic device among which is defined a programmable logic device 10a in a master mode (hereinafter, referred to as a master logic device) to which a read only memory (ROM) 20 that stores therein logical function configuration data of each programmable logic device is connected. Alternatively, n programmable logic devices 10b in a slave mode, for example, of the same hardware as that of the foregoing master logic device 10a, slaved to the same are connected to the foregoing master logic device 10a in series.

For loading the logical function configuration data, the master logic device 10a outputs an address from an address counter 11 thereof to the ROM 20 which then outputs configuration data of 8 bits for example corresponding to that address. On the basis of the configuration data master data is first stored in a circuit configuration memory 12 of the master logic device 10a, and then slave data is outputted from an output terminal Dout of the master logic device 10a and inputted into an input terminal Din of a downstream slave logic device 10b, and further transferred to successive slave logic devices in the order of from slave No. 1 to No. n and stored in those slave logic devices. In other words, the logic devices 10b serving as slaves other than the master logic device 10a receive the logical function configuration data from the ROM 20 through the master logic device 10a. Herein, after completion of the configuration mode, the operation enters a use mode.

The master logic device 10a therefore has a need of supplying a sync. clock CCLK for determining data incorporation timing to each slave logic device 10b in order to enable each slave logic device 10b to accurately receive the configuration data, and of counting the total clock number until the logical function configuration data is transferred to all slave logic devices 10b to take synchronism upon the configuration for all logic devices being completed, and further of, after the configuration data is stored in circuit configuration memory 12 of all programmable logic devices, interrupting the sync. clock CCLK to complete the configuration mode and enter the use mode.

For this reason, conventionally, in a system including a plurality of the programmable logic devices, each programmable logic device incorporates a pulse counter 16 therein besides a pulse generator (PG) 14 to control the generation of the synchronizing clock CCLK pulse by writing in the configuration data for the master logic device 10a the number of generated pulses of the synchronizing clock CCLK corresponding to the total data number for loading the configuration data from the ROM 20 to the whole system.

In such a system, however, each programmable logic device is inevitably required to incorporate therein the pulse counter 16 and each slave logic device 10b is also required to include the same pulse counter as that in the master logic device 10a, resulting in a disadvantage of a system area being increased to prevent the system from being integrated. Additionally, since the total configuration data number of the system is determined by the size of the pulse counter 16, for systems large-sized to some extent in which many programmable logic devices operate, the pulse counter 16 is obliged to be one of a relatively large size. Alternatively, in a small-sized system in which there is no need of use of a plurality of programmable logic devices, the pulse counter 16 is quite wasteful, resulting in the increased chip cost and lowered yield.

SUMMARY OF THE INVENTION

In view of drawbacks with the prior art, it is an object of the present invention to provide a semiconductor integrated circuit and a programmable logic device for use in the former, the semiconductor integrated circuit being not in need of the provision of pulse counters corresponding to the total data number for storing therein circuit function configuration data for the whole system.

To achieve the above object, there is provided a semiconductor integrated circuit according to the present invention which includes a master mode programmable logic device and at least one slave mode programmable logic device located downstream of the master mode logic device and having a logical function thereof defined by configuration data inputted from said master mode logic device or an upstream slave mode logic device through a data line, and which is characterized in that the upstream slave mode logic devices are informed successively of completion of the configuration for each slave mode logic device through said data line and finally said master mode logic device is informed of completion of the configuration for all slave mode logic devices.

Additionally, a semiconductor integrated circuit of the present invention temporarily changes the period of the clock supplied from said master mode logic device to each slave mode logic device when the configuration for all slave mode logic devices has been completed to inform each slave mode logic device of the completion of the configuration for all slave mode logic devices.

There is further provided a programmable logic device according to the present invention having a logical function determined by configuration data inputted from the outside, which comprises input means for inputting at least part of a number of groups of the configuration data, to which a boundary detection code is added for each configuration data corresponding to one logic device and hence is made identifiable, in synchronism with a clock inputted from the outside; holder means for temporarily holding the data inputted through said input means; output means for outputting the same data held by said holder means to an output terminal, to which a downstream programmable logic device is connected, in synchronism with said clock; a programmable logic block having a logical function thereof determined by at least the part of the groups of the configuration data inputted through said input means; downstream data storage/detection means for comparing an output terminal mode of said output means and the data temporarily held by said holder means to detect the completion of the data storage in said downstream logic device; data switching means for separating said configuration data from said output means on the basis of an output from said downstream data storage/detection means and inputting the same into said programmable logic block; an input fixing means for temporarily fixing an input terminal node of said input means as the data storage in said programmable logic block has been completed and transmitting the completion of the data storage in said programmable logic device to an upstream programmable logic device.

There is further provided a programmable logic device according to the present invention in which said synchronizing clock supplied from the master mode programmable logic device to the slave mode programmable logic device disposed downstream of said master mode logic device is interrupted by the output of the downstream data storage/detection means.

There is further provided a programmable logic device according to the present invention in which to the output terminal of a most downstream programmable logic device output fixing means is connected to fix that node at least during the configuration.

In accordance with the semiconductor integrated circuit of the present invention, the upstream slave mode logic devices are informed successively of the completion of the configuration of each slave mode logic device through the data line fed to the slave side, and finally the master mode logic device is informed of the completion of the configuration for all slave mode logic devices. The generation of the basic clock by the master mode logic device is accordingly achieved without use of a large-scaled circuit such as a pulse counter and the like, and hence there is eliminated limitation on the number of the slave mode logic devices due to the size of such a pulse counter. It is therefore possible to realize a more highly integrated semiconductor integrated circuit (programmable logic device) and assure very higher industrial advantages such as improvements of the yield and the productively.

Particularly, in the case where the period of the clock supplied from said master mode logic device to each slave mode logic device is temporarily changed upon the completion of the configuration for all slave mode logic devices to inform each slave mode logic device of the completion of the configuration for all slave mode logic devices, it is possible to terminate the configuration mode with all logic devices in synchronism with each other and switch the operation to a use mode of an I/O (Input/Output) and the like.

In the case where the configuration for the master mode logic device is first effected, it is possible to deliver the configuration data after the slave mode logic device has been stabilized in its operation.

Additionally, in accordance with the programmable logic device, the boundary detection code is added to a number of the logical function configuration data for each one logic device fraction to make the boundaries identifiable, and on the basis of the completion of the storage of the configuration data to define the logic function of the programmable logic block in the programmable logic device, the input terminal node of the input means, into which a number of groups of the configuration data are inputted, is temporarily fixed and the output terminal node of the upstream programmable logic device connected to the input terminal node is compared with the data temporarily held by the holder means, which temporarily holds the data inputted into the input means, to detect the completion of the data storage in the associated logic devices (downstream side viewed from the upstream programmable logic device) and inform the upstream logic device of the completion of the data storage in the associated programmable logic device. Therefore, said semiconductor integrated circuit can be constructed with ease.

BRIEF DESCRIPTION OF THE DRAWINGS

The preferred embodiments will be described with reference to the drawings, wherein like elements have been described throughout the figures with like reference numbers, and wherein.

DESCRIPTION OF THE PREFERRED EMBODIMENTS

In what follows, embodiments of the present invention will be described in detail with reference to the accompanying drawings.

Figure 1:
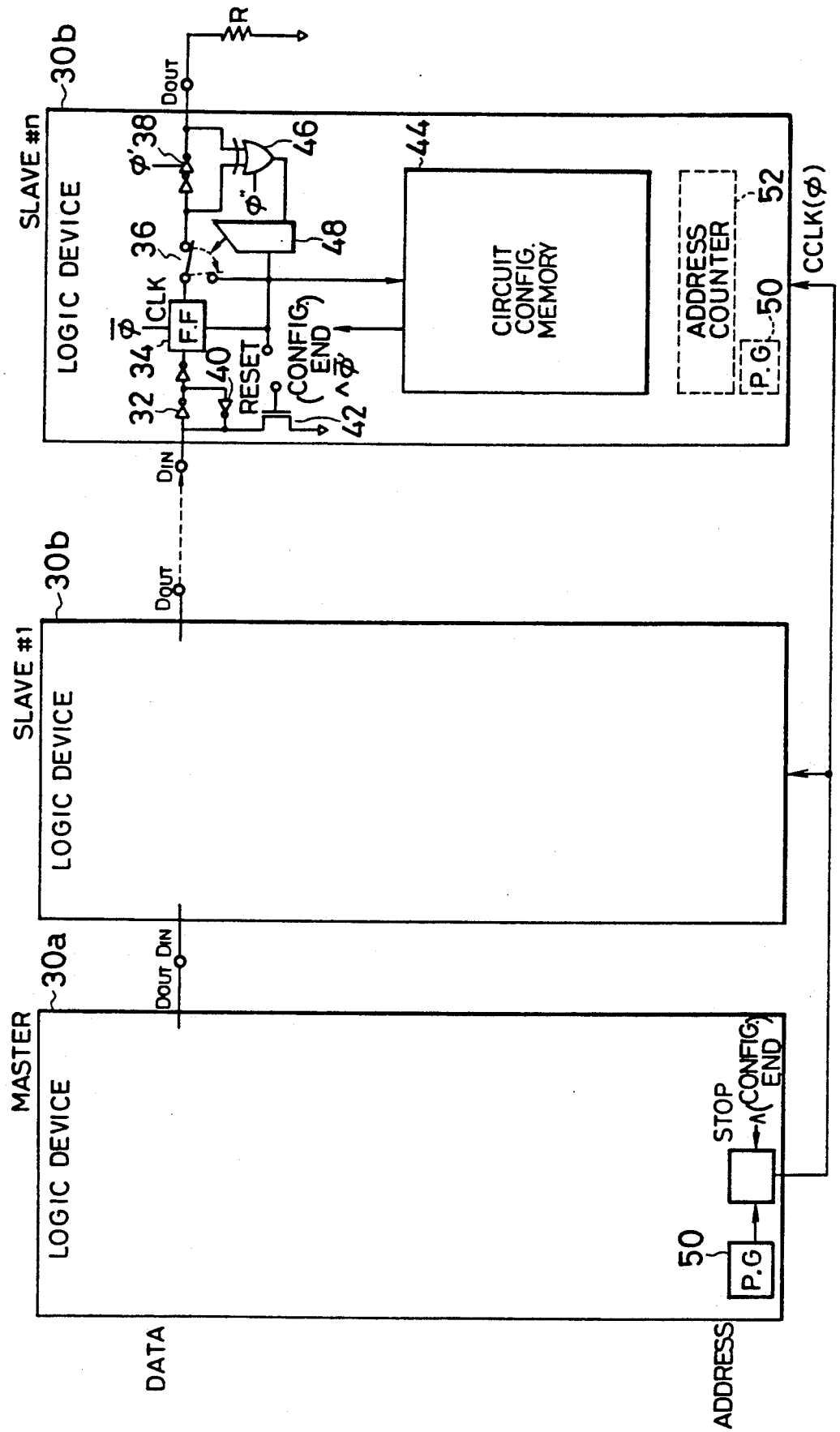
FIG. 1 is a block diagram exemplarily illustrating a semiconductor integrated circuit including a plurality of programmable logic devices as a first embodiment of the present invention.

Referring to FIG. 1, there is illustrated a portion of a semiconductor integrated circuit including a master mode logic device 30a and n slave mode logic devices 30b, both constructed with use of the first embodiment of the programmable logic device according to the present invention.

Figure 2:
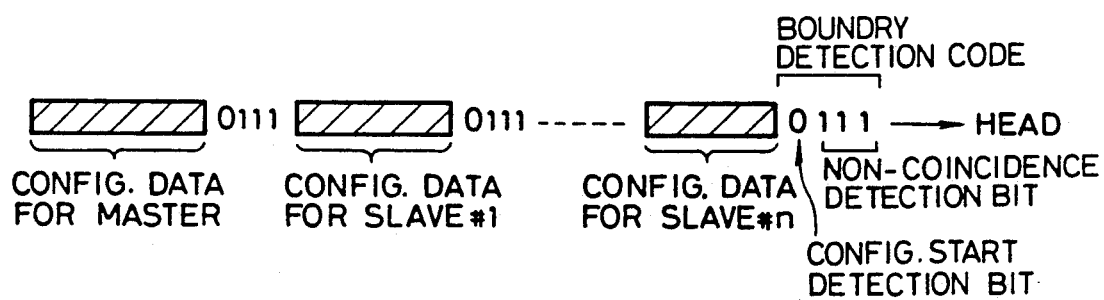
FIG. 2 is a diagram exemplarily illustrating the sequence of groups of configuration data for use in the first embodiment.

A series of groups of configuration data used in the present embodiment additionally include, as illustrated in FIG. 2, a boundary detection code for each configuration data corresponding to one logic device, the code comprising a plurality of bits from the head, say, three bits "1" and one bit "0" located next to the three bits for informing the initiation of the configuration.

The reason why the first three bits of the boundary detection code are assumed to be "1" is that the input terminal Din of the downstream logic device, i.e., the output terminal Dout of that logic device is pulled down upon the completion of the storage of the downstream data. Oppositely, when the input terminal Din of the downstream logic device is adapted to be pulled up upon the completion of the data storage in the downstream logic device, the boundary detection code can be assumed to be "0001" for example in order from the top thereof.

Figure 10:
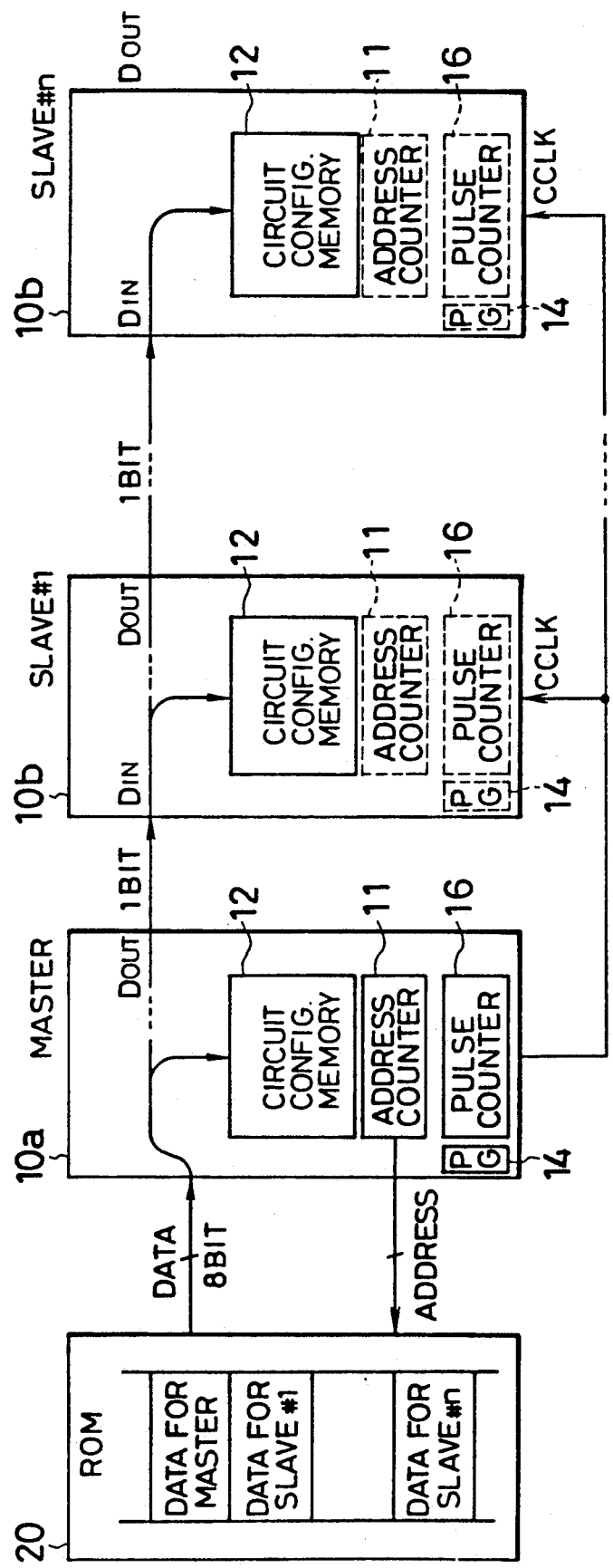
FIG. 10 is a block diagram exemplarily illustrating a system incorporating a plurality of prior programmable logic devices.

Each programmable logic device includes no pulse counter, unlike the prior example illustrated in FIG. 10. Although likewise the prior example a synchronizing clock CCLK is supplied from the master mode logic device 30a to the slave mode logic devices 30b, a control signal to interrupt the supply of the synchronizing clock CCLK is inputted from the downstream slave logic device through the output terminal Dout in the present embodiment, not from a pulse counter as in the prior example. This is the basic idea of the present invention, and will be described in detail.

Each programmable logic device has an input terminal Din and an output terminal Dout for the logical function configuration data likewise the prior example.

The logical function configuration data, as illustrated in FIG. 2, inputted through the input terminal Din is inputted into a flip-flop (F.F.) 34 through an input buffer 32, and further inputted into the input terminal Din of the downstream slave mode logic device through a switch 36 and an output buffer 38. Herein, the flip-flop 34 takes as a clock input thereof an inverse signal $\bar{\phi}$ of the synchronizing clock CCLK ($\phi$) as exemplified in FIG. 3, and the output buffer 38 is operated in synchronism with a clock $\phi'$ being part of the clock $\phi$ (refer to FIG. 3 or FIG. 4). The configuration data is therefore outputted at the rising-up edge of the clock $\phi'$ and inputted into the downstream slave mode logic device at the falling-down edge of the clock $\phi$.

To the input buffer 32 there are connected an invertor 40 for weak latching and an input fixing transistor 42 composed of an n channel MOS transistor for example for pulling down and fixing an input terminal Din node as the data storage in the same logic device has been completed.

The switch 36 is to connect the output of the flip-flop 34 to the output buffer 38 in the initial state of the operation after a power supply is turned on.

The latching invertor 40 is to hold the data when the input fixing transistor 42 is off and can be disposed with when there is a capacitive (parasitic) element on the front stage thereof which serves as holder means.

Important here is a circuit arrangement where the switch 36 is switched to an internal circuit configuration memory 44 for logical configuration for the associated logic devices.

Figure 3:
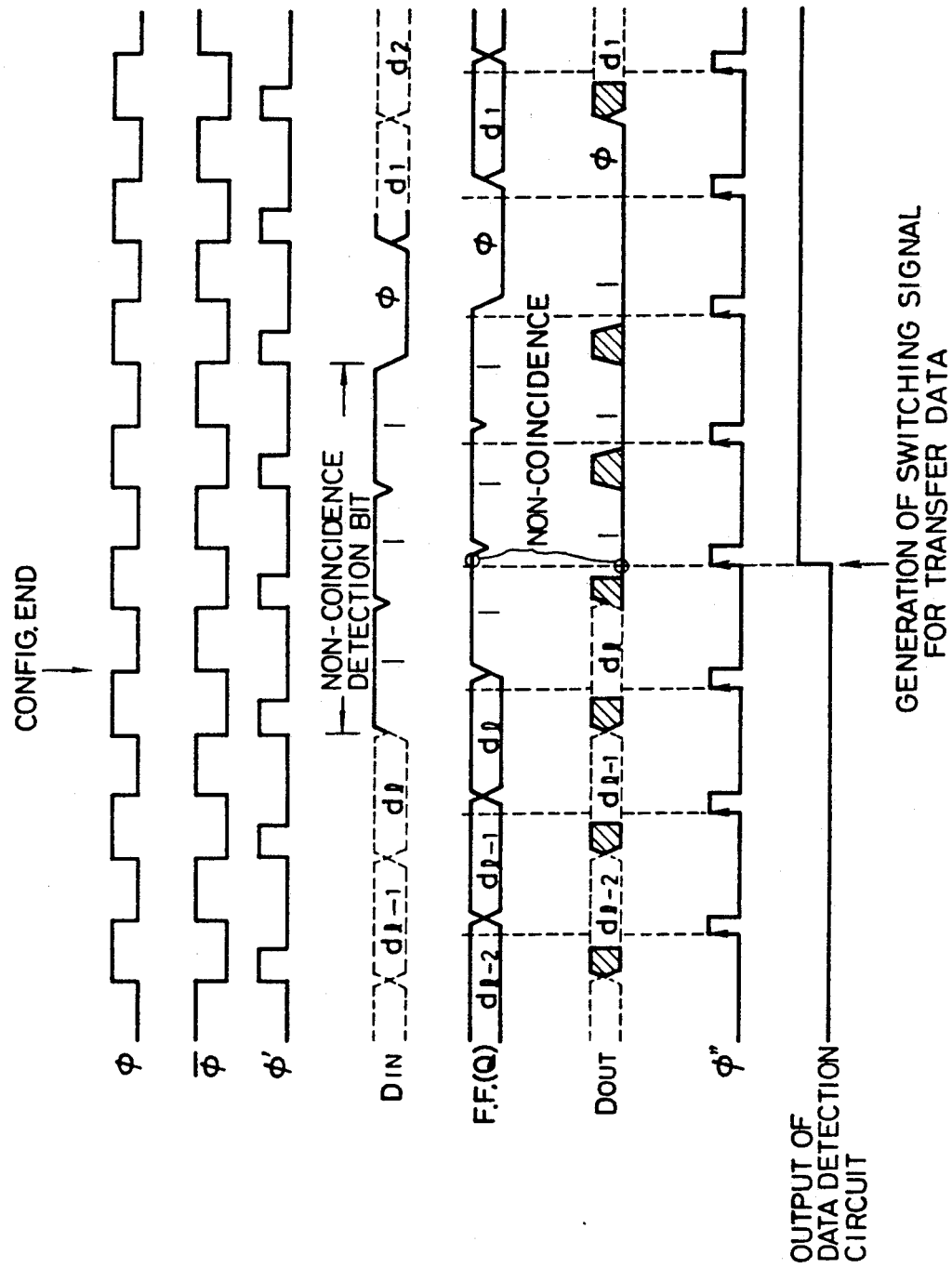
FIG. 3 is a timing chart exemplarily illustrating operation timing of a data detection circuit in the first embodiment.

In the present embodiment, there is provided a non-coincidence detection circuit 46 for detecting the boundary detection codes included in the series of groups of the configuration data by exclusive-ORing the node of the output buffer 38 (i.e., the node of the output terminal Dout) and the node of the flip-flop 34 in order to detect the completion of the storage of the downstream data. More specifically, when the output terminal Dout has been pulled down by the input fixing transistor 42 of the downstream logic device or the output fixing resistor R in case of the most downstream logic device, an output is available from the non-coincidence detection circuit 46 as illustrated in FIG. 3 when the boundary detection code "111" is inputted into the non-coincidence detection circuit. Herein, the reason why the on-time of an actuating signal $\phi''$ for the non-coincidence detection circuit 46 is shorter than the corresponding clock $\phi$ is that it prevents the non-coincidence detection circuit 46 from being erroneously operated owing to a fact that the pulling-down by the input fixing transistor, etc., and the next data overlap.

On the basis of the output signal from the non-coincidence detection circuit 46, the data detection circuit 48 is activated to switch the switch 36 for introduction of configuration data required for the circuit configuration memory 44 included in the same logic device. Further, when the storage of the configuration data into the circuit configuration memory 44 has been completed, the input fixing transistor 42 is switched on at the timing of a clock $\bar{\phi}'$ on the basis of a configuration end signal outputted from the circuit configuration memory 44 to cause the input terminal Din of the same logic device to be pulled down.

The present logic device has therefore completed the introduction of the configuration data for itself and the storage of the same, and fixed the node of the input terminal Din thereof to "0" in synchronism with the clock $\bar{\phi}'$.

At this time, there has been inputted into the input terminal Din a signal of a plurality of "1s" indicative of the boundary of the configuration data from the output terminal Dout of the upstream logic device. The upstream logic device accordingly detects non-coincidence between the signal "1" inputted from the flip-flop 34 thereof and the signal "0" at the node of the output terminal Dout, and hence detects that a configuration signal sent after the plurality of "1s" (three in the present embodiment) indicative of the boundary of the configuration data is data to be stored in the circuit configuration memory 44 in itself, to switch the switch 36 toward the circuit configuration memory 44.

After the sequence of the operation has been repeated successively, there is interrupted the supply of the clock CCLK ($\phi$) supplied from a pulse generator (PG) 50 thereof to the external slave mode logic device 30b using the output from a data detection circuit 48 (not shown) provided at an internal output terminal Dout of the master logic device 30a and using a configuration end signal issued from itself.

Herein, designated at 52 in FIG. 1 is an address counter.

Figure 5:
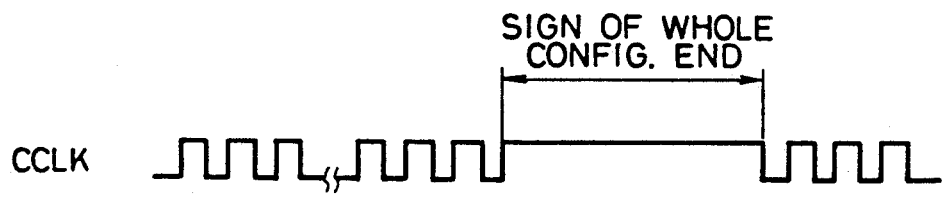
FIG. 5 is a diagram exemplarily illustrating a clock waveform upon the completion of the whole configuration in a modification of the first embodiment.

Additionally, after the master mode logic device 30a has finally been informed, as described above, of the overall configuration completion, it may also be possible that the period of the clock CCLK is temporarily changed as illustrated in FIG. 5 to also inform each slave mode logic device 30b of the overall configuration completion and switch the operation to the use mode such as an I/O, etc., in synchronism.

Furthermore, the most downstream slave mode logic device 30b includes no logic device on the downstream side thereof. Accordingly, the non-coincidence detection circuit 46 may be activated by earthing the output terminal Dout of the most downstream slave logic device 30b to pull down the same through a resistor R of about 5 to 10 KΩ for example at all times or only during the configuration.

Although in the above description the slave mode logic devices and the master mode logic device were shown in their operations independently separately, all actual circuit arrangements thereof are common.

In the following, another modification of the data detection circuit for the node signal at the output terminal Dout and for the signal outputted from the flip-flop will be described with reference to FIGS. 6 and 7.

Figure 6:
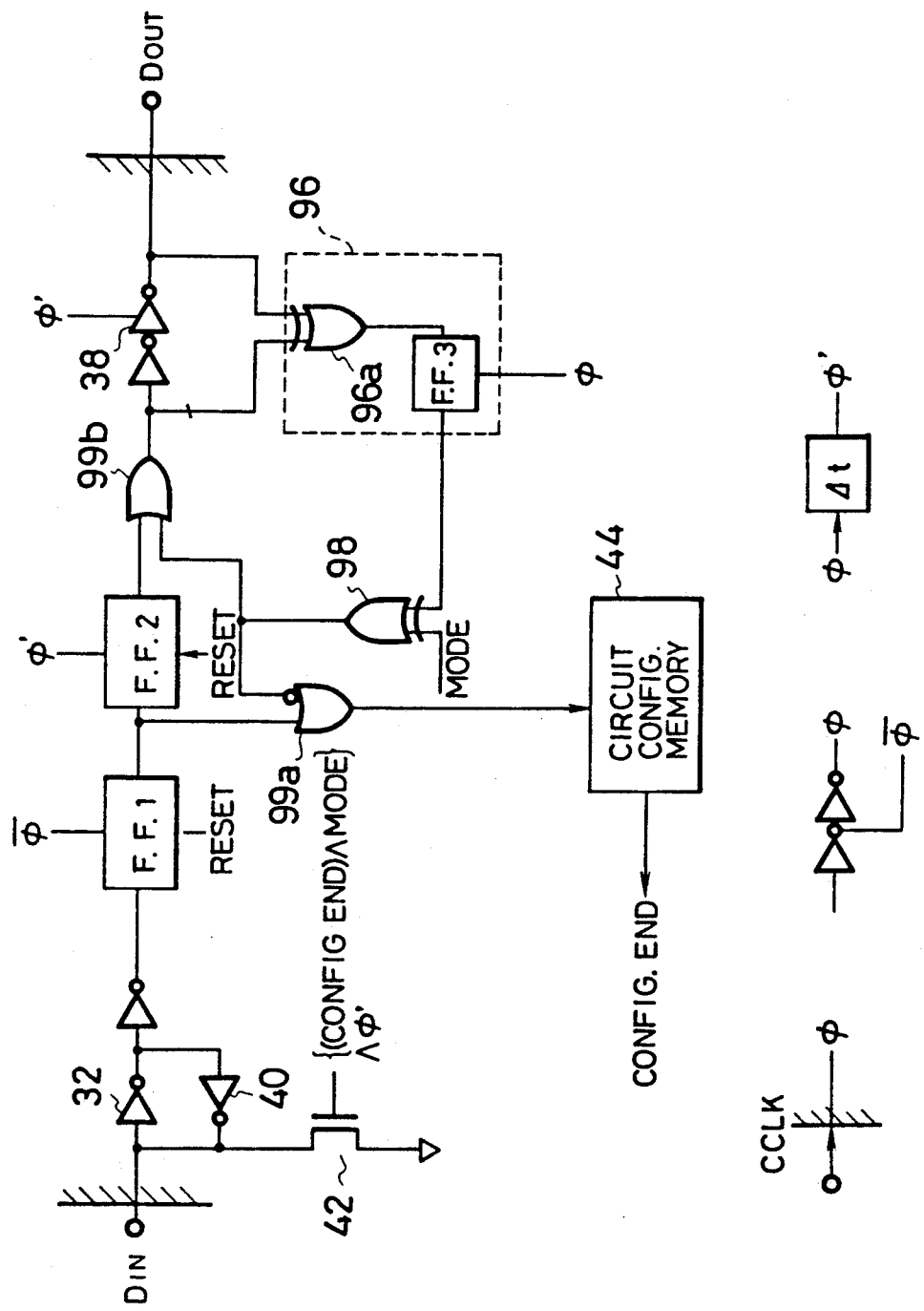
FIG. 6 is a circuit diagram exemplarily illustrating another arrangement of the data detection circuit in the first embodiment.

FIG. 6 embodies the circuit of FIG. 1, in which two flip-flops F.F. 1 and F.F. 2 are employed to ease timing design and flip-flop F.F. 3 and an exclusive OR gate 96a have the same function as that of the non-coincidence detection circuit 46 shown in FIG. 1.

Figure 7:
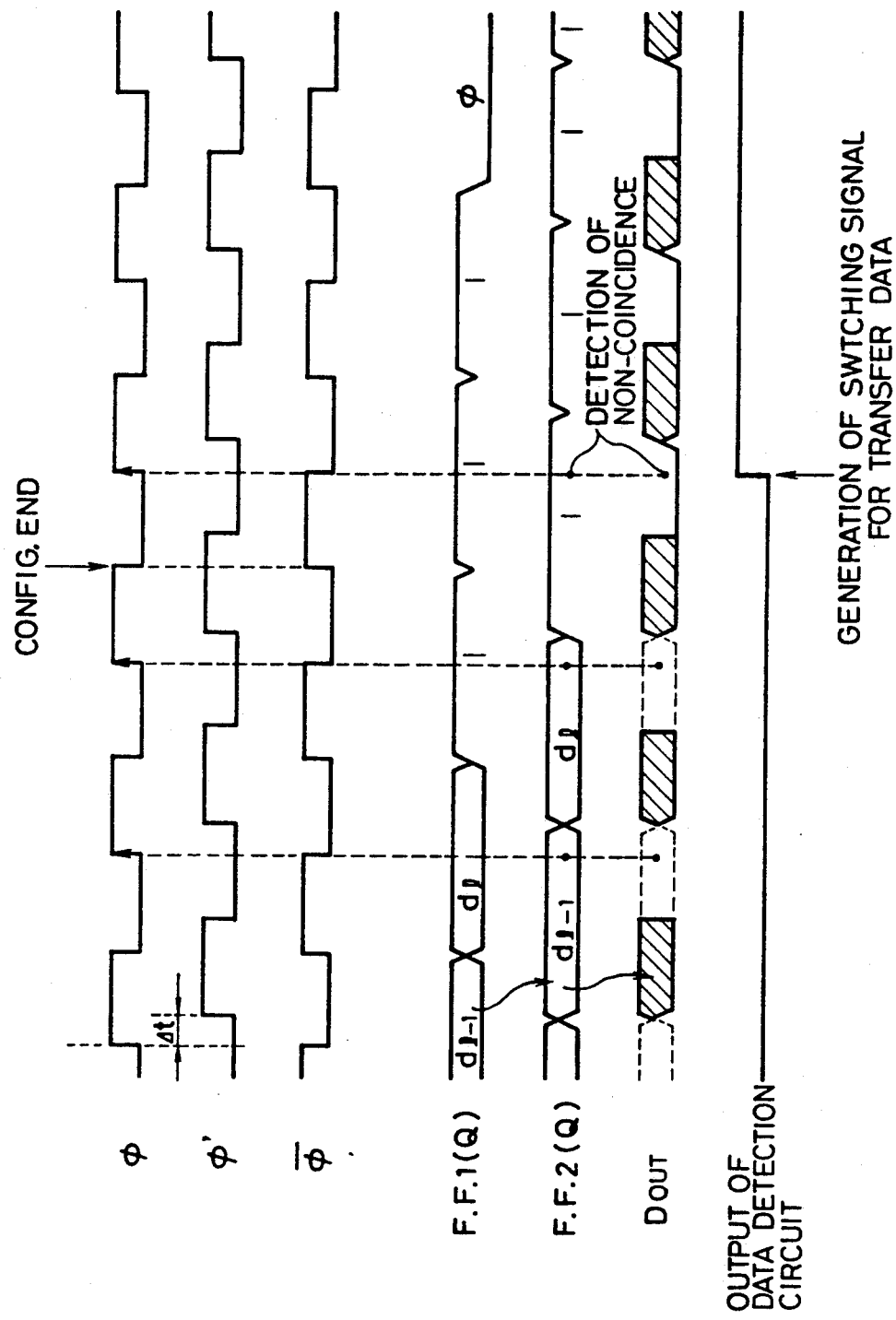
FIG. 7 is a timing chart illustrating the operation timing of the circuit of FIG. 6.

FIG. 7 illustrates circuit operation timing. Input data into the input terminal Din is latched by F.F. 1 in timing of the rising-up edge of the clock $\bar{\phi}$, and further latched by F.F. 2 in timing of the rising-up edge of the clock $\phi'$. The data is determined at this time on whether it is outputted to Dout or inputted into the internal circuit configuration memory 44, by an exclusive OR gate 98. More specifically, when an output of the non-coincidence detection circuit 96 is "0" (i.e., when non-coincidence is not detected) and the MODE signal is "0", the exclusive OR gate 98 has an output "0", which is then inputted into two OR gate 99a, 99b to activate only the OR gate 99a, and hence the data is inputted into the circuit configuration memory 44. Alternatively, when the MODE signal is "1", only the OR gate 99b is reversely activated, and hence the data is outputted to Dout through the output buffer 38.

A case will here be considered chiefly for description of the function of the non-coincidence detection circuit 96, where the data is output to the the terminal Dout through the output buffer 38. On the terminal Dout, the data is driven by the output buffer 38 activated by the clock $\phi'$, and during a half period where the data is not driven the operation is different depending upon operating conditions at the terminal Din of the downstream logic device. In the case for example where writing of the configuration data into the downstream logic device has not yet been completed, the downstream side terminal Din holds the data on the upstream side terminal Dout (refer to FIG. 7). Alternatively, the upstream non-coincidence detection circuit 96 compares the terminal Dout node with the output Q of F.F. 2 at the timing of the rising-up edge of the clock $\phi$ at all times and does not detect non-coincidence therebetween.

However, once final data dl is written into the downstream configuration memory and the configuration is completed, the downstream device forcedly pulls down the terminal Din at the timing of the clock $\bar{\phi'}$, i.e., at the timing the upstream device terminal Dout is not driven. Additionally, at the upstream device terminal Dout a bit "1" for detection of non-coincidence latched by F.F. 2 has been outputted, and this data "1" is pulled down at the timing of the clock $\bar{\phi}$ into "0". This is compared with the output Q "1" of F.F. 2 at the rising-up edge of the clock $\phi$ and a non-coincidence signal "1" is generated and inputted into the exclusive OR gate 98. Further, an output of the exclusive OR gate is changed from "1" to "0" whereby the data is then inputted into the circuit configuration memory 44 (refer to FIG. 7).

Although in the above first embodiment the configuration for the logical function of the master mode logic device 30a is to be effected finally, the starting-up time of each logic device is varied, so that there may be a possibility that the configuration data is more rapidly sent out than the starting-up of each slave mode logic device. Accordingly, there sometimes arises a case in view of waiting the stabilization of the operation for each slave mode logic device 30b that the configuration for the master mode logic device 30 may rather be effected in the first place. In the following, a second embodiment of the present invention preferable for the above situation will be described.

Figure 8:
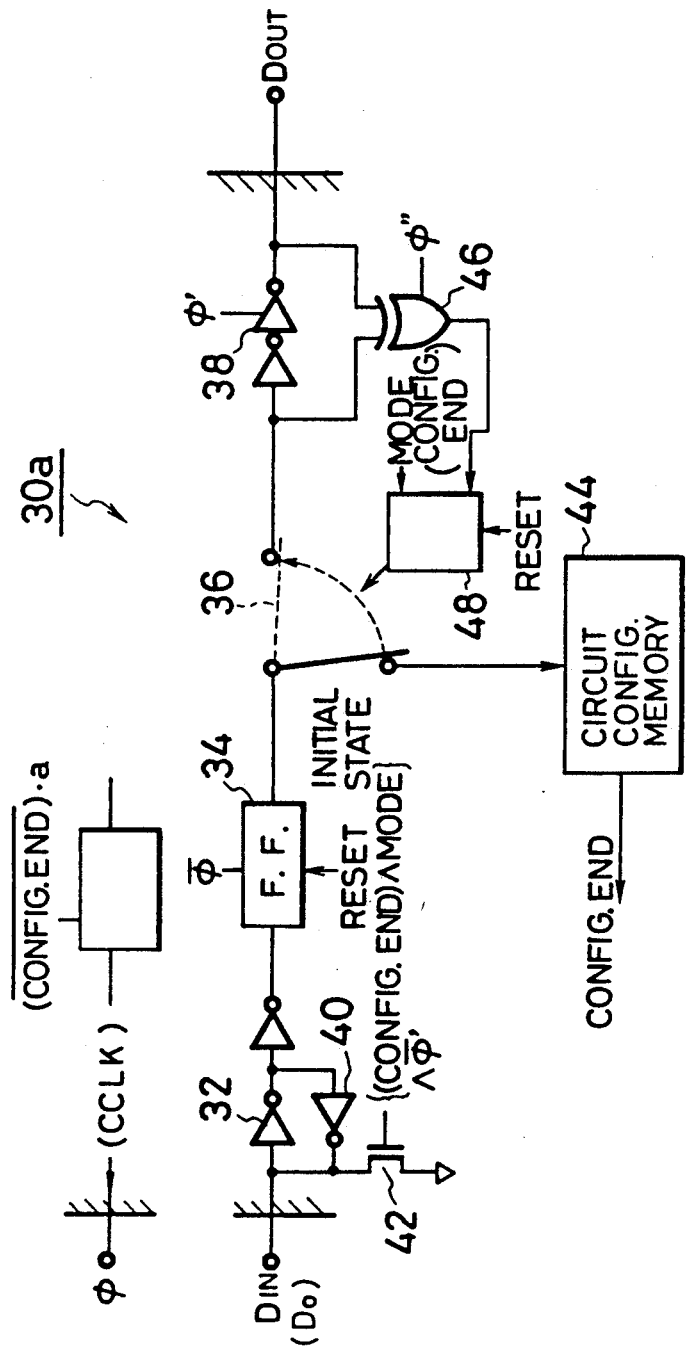
FIG. 8 is a circuit diagram illustrating the arrangement of the second embodiment of the present invention and a state of the same set in a master mode.

A portion of a programmable logic device associated with the second embodiment (from an input terminal Din to an output terminal Dout) is arranged as illustrated in FIG. 8, which is different from the above first embodiment in that an initial position of the switch 36 determined by the output of the data detection circuit 48 and the on/off state of the input fixing transistor 42 determined by the configuration end signal from the circuit configuration memory 44 can be changed between the master mode and the slave mode.

Other features are the same as those of the first embodiment and so the description will be neglected.

Figure 9:
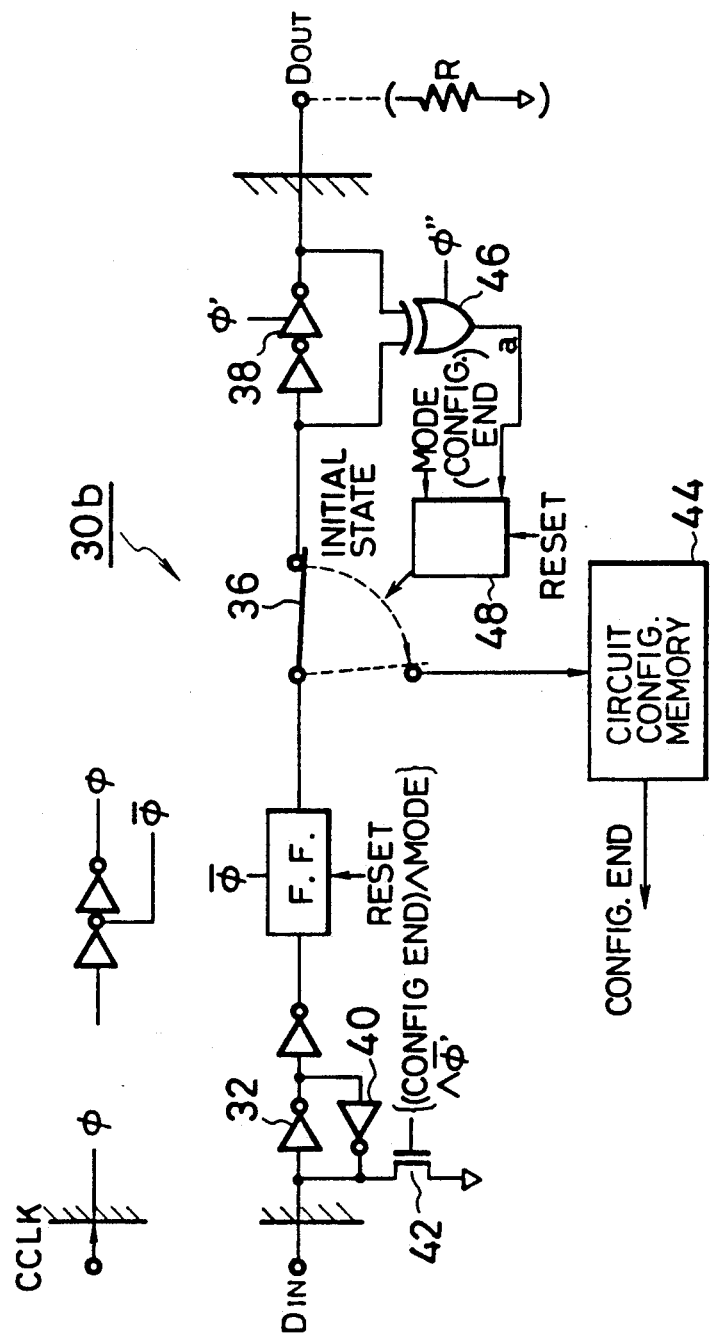
FIG. 9 is likewise a circuit diagram illustrating the state of the programmable logic device set in a slave mode.

In the second embodiment, a switch 36 of a logic device as the master mode is to introduces, as illustrated in FIG. 8, configuration data inputted through an input buffer 32 and a flip-flop 34 into a circuit configuration memory 44 included therein at the initial state after the power supply in turned on, in the opposite manner as a slave mode logic device 30b illustrated in FIG. 9. Additionally, the input fixing transistor 42 is operated also taking into consideration the state of a mode signal MODE which is "0" when it is used as a master where a node of the input terminal Din is not pulled down and allowed to pass through to the later stage even though configuration for itself is completed and which is "1" when it is used as a slave.

On the other hand, in the second embodiment, a programmable logic device 30b in the slave mode is adapted such that the switch 36 is switched to pass therethrough configuration data toward the output buffer 38 upon the power supply being turned on likewise the first embodiment as illustrated in FIG. 9 and that the input fixing transistor 42 is pulled down immediately upon the configuration for itself being completed.

Figure 4:
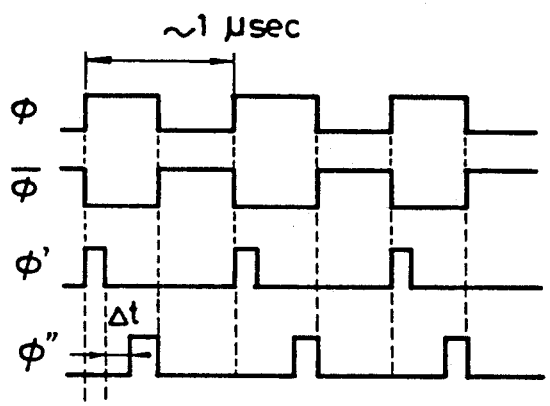
FIG. 4 is a timing chart exemplarily illustrating clock timing of the data detection circuit in the first embodiment and a second embodiment.

Each clock waveform in the second embodiment is the same as that illustrated in FIG. 4.

Further, the aforementioned embodiments examplifies the circuit arrangement of the programmable logic device associated with the present invention which arrangement is not limited thereto.

What is claimed is:

1. A semiconductor integrated circuit including a master mode programmable logic device and at least one slave mode programmable logic device located downstream of said master mode logic device, each said slave mode logic device having a logical function thereof defined by configuration data inputted through said master mode logic device or any upstream slave mode logic device through a data line, characterized in that
   said upstream slave mode logic device is successively informed of completion of configuration for each said slave mode logic device through said data line; and
   said master mode logic device is finally informed of completion of the configuration for all slave mode logic devices.

2. A semiconductor integrated circuit according to claim 1 wherein period of a clock supplied from said master mode logic device to each said slave mode logic device is temporarily vaired at the time the configuration for all slave mode logic devices has been completed, to inform each slave mode logic device of the configuration for all slave mode logic devices having been completed.

3. A semiconductor integrated circuit according to claim 1 wherein the configuration for the master mode logic device is first effected in order to wait for the slave mode logic device being stabilized in their operation.

4. A programmable logic device having a logical function thereof determined by configuration data inputted from the outside, said programmable logic device comprising:
   input means for inputting at least part of a number of groups of the configuration data, for which a boundary detection code is added to each configuration data corresponding to one logic device for identification of said each configuration data, in synchronism with a clock inputted from the outside;
   holder means for temporarily holding said data inputted through said input means;
   output means for outputting the same data held by said holder means to an output terminal to which a downstream programmable logic device is connected in synchronism with said clock;
   a programmable logic block having a logical function determined by at least the part of the group of the configuration data inputted through said input means;
   downstream data storage/detection means for comparing an output terminal node of said output means and the data temporarily held by said holder means to detect the completion of the data storage of the downstream logic device;
   data switching means for separating said configuration data from said output means on the basis of the output of the downstream data storage/detection means and inputting the same into said programmable logic block; and
   input fixing means for temporarily fixing an input terminal node of said input means upon the completion of the data storage into said programmable logic block and informing the completion of the data storage to an upstream programmable logic device.

5. A programmable logic device according to claim 4 wherein said boundary detection code comprises a signal formed of the same logic levels successively arranged by a plurality of numbers thereof from the head thereof and an opposite logic level signal arranged next to said same logic level signal for informing starting of the configuration.

6. A programmable logic device according to claim 4 wherein latch means is provided in said input means for holding data when said input fixing means is off.

7. A programmable logic device according to claim 4 wherein said holder means comprises a plurality of flip-flops.

8. A programmable logic device according to claim 4 wherein said downstream data storage/detection means includes a non-coincidence detection circuit for detecting said boundary detection code of the number of the groups of the configuration data by taking exclusive OR between said output terminal node and said holder means node.

9. A programmable logic device according to claim 8 wherein said non-coincidence detection circuit comprises a flip-flop and an exclusive OR gate.

10. A programmable logic device according to claim 8 wherein on-time of an actuation signal for said non-coincidence detection circuit is shortened compared with a corresponding clock.

11. A programmable logic device according to claim 4 wherein said data switching means includes two OR gates which are turned on in a complementary relation.

12. A programmable logic device according to claim 4 wherein said data switching means connects an output of said holder means to said output means in the initial stage of the operation after a power supply is turned on.

13. A programmable logic device according to claim 4 wherein said data switching means first introduces with respect to the master mode logic device, configuration data of the output of said holder means into a programmable logic block in itself in the initial stage of the operation after the power supply is turned on.

14. A programmable logic device according to claim 4 wherein said input fixing means does not fix with respect to the master mode logic device, the node of the input terminal even after configuration has been completed in itself for downward transmission of the configuration data.

15. A programmable logic device according to claim 4 wherein the synchronizing clock supplied from the master mode programmable logic device to the downstream slave mode programmable logic device is interrupted by an output from the downstream data storage/detection means.

16. A programmable logic device according to claim 4 wherein output fixing means for fixing a node of an output terminal of the most downstream programmable logic device at least during the configuration, is connected thereto.

* * * * *

UNITED STATES PATENT AND TRADEMARK OFFICE
CERTIFICATE OF CORRECTION

PATENT NO. : 5,084,636

DATED : January 28, 1992

INVENTOR(S) : Masato YONEDA

It is certified that error appears in the above-identified patent and that said Letters Patent is hereby corrected as shown below:

On the title page, Item [73] Assignee's

In the Assignment, change the assignee from "Kawasaki Steel" to --Kawasaki Steel Corporation--.

Signed and Sealed this

Twenty-sixth Day of October, 1993

*Attest:*

BRUCE LEHMAN

*Attesting Officer*  *Commissioner of Patents and Trademarks*